(12) United States Patent
Gaudiana et al.

(10) Patent No.: US 6,856,339 B2
(45) Date of Patent: *Feb. 15, 2005

(54) INTEGRAL ORGANIC LIGHT EMITTING DIODE PRINTHEAD UTILIZING COLOR FILTERS

(75) Inventors: Russell A. Gaudiana, Merrimack, NH (US); Richard G. Egan, Dover, MA (US)

(73) Assignee: Polaroid Corporation, Waltham, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/616,197

(22) Filed: Jul. 9, 2003

(65) Prior Publication Data

US 2004/0012020 A1 Jan. 22, 2004

Related U.S. Application Data

(62) Division of application No. 09/745,042, filed on Dec. 20, 2000, now Pat. No. 6,624,839.

(51) Int. Cl.[7] .................................................. B41J 2/45
(52) U.S. Cl. ........................................................ 347/238
(58) Field of Search ................................. 347/130, 232, 347/238, 132, 237, 247; 315/169.3; 313/506

(56) References Cited

U.S. PATENT DOCUMENTS

| 6,208,083 B1 | * | 3/2001 | Suzuki et al. ............. 315/169.3 |
| 6,339,291 B1 | * | 1/2002 | Codama ..................... 313/506 |
| 6,525,758 B2 | * | 2/2003 | Gaudiana et al. ........... 347/238 |

FOREIGN PATENT DOCUMENTS

| WO | WO 99/45558 | 9/1999 | ............. H01J/1/63 |
| WO | WO 00/16938 | 3/2000 | ............. B23B/7/02 |

* cited by examiner

Primary Examiner—Hai Pham

(57) ABSTRACT

A compact light weight printhead capable of direct quasi-contact printing includes an OLED—Color Filter structure deposited onto a substrate. The OLED—Color Filter structure includes an OLED structure emitting over a broad range of wavelengths and color filter arrays that selectively transmit radiation in different distinct ranges of wavelengths. The printhead is designed for contact or quasi-contact printing, without additional optical elements. The printhead design ensures that the desired pixel sharpness and reduced crosstalk is achieved.

4 Claims, 15 Drawing Sheets

OLED Contact Print Engine

OLED Array with Air Gap

Relative Intensity Profile on Film 1 with and without Air Gap
Both the OLED and Film 1 Cover Sheet = 0.7mils (combined 1.4 mils)

INTEGRAL ORGANIC LIGHT EMITTING DIODE PRINTHEAD UTILIZING COLOR FILTERS

CROSS-REFERENCE TO RELATED APPLICATION

This is a divisional application of prior application Ser. No 09/745,042, filed on Dec. 20, 2000 now U.S. Pat. No. 6,624,839 by Russell A. Gaudiana et al. and entitled INTEGRAL ORGANIC LIGHT EMITTING DIODEPRINTHEAD UTILIZING COLOR FILTERS.

BACKGROUND OF THE INVENTION

1. Field of the Invention

This invention relates generally to compact, light weight printheads and, more particularly, to integral Organic Light Emitting Diode (OLED) printheads.

2. Background

Light emitting diodes (LED) have been used for exposing photosensitive materials such as photographic film or photosensitive paper or photocopying receptors. The light emitting diodes are usually arranged in a linear array or a number of linear arrays and means are provided for a relative displacement of the photosensitive materials in relation to the array. In this manner, the material is scanned past the array and an area is exposed thereby creating an image.

The light emitted from LEDs diverges quickly and thus reduces the exposing intensity and increases the exposing area. This can lead to a reduction in sharpness of the exposed image and to the possibility of undesired exposure of adjacent areas. The first of these problems is known as reduced pixel sharpness and the second is known as crosstalk. To avoid these difficulties, optical systems are utilized to transmit the light from the LEDs to the photosensitive material without significant divergence. While this approach results in an acceptable printing system, such systems have their size defined by the optical systems and therefore are not as compact as would be desired for a portable print system.

The light emitting diodes used in present printers (see for example, Shimizu et al., *LED Arrays, Print Head, and Electrophotographic Printer*, U.S. Pat. No. 6,064,418, May 16, 2000) emit radiation from the surface of a p-n junction (constitute edge emitters) and are typically mounted on a printed circuit board. These characteristics of the LEDs used in previous printers impose constraints on manufacturability and preclude their use in contact or quasi-contact printing. Other light source systems (LCDs for example) presently used in printers suffer from similar constraints that preclude their use in contact or quasi-contact printing. Innovative designs are needed to satisfy the need for compact printers.

Organic Light Emitting Diodes (OLED), which have been recently developed, (See, for example, the article by S. Forrest, P. Burrows, M. Thompson, *"The Dawn of Organic Electronics"*, IEEE Spectrum, Vol. 37, No, 8, pp. 29–34, August 2000) hold a promise of ease of fabrication and low cost and low power consumption. A recent publication (Y. Tsuruoka et al., "Application of Organic Electroluminescent Device to Color Print Head", SID 2000 Digest, pp. 978–981), describes a print head utilizing OLEDs. The printhead described in this publication is comprised of discrete OLEDs, color filters and optical elements and therefore is not as compact as desired. Also, the presence of discrete optical elements requires considerations of alignment which have an impact on manufacturability and cost.

It is the primary object of this invention to provide an integral printhead which is compact and light weight and utilizes Organic Light Emitting Diodes (OLED). It is a further object of this invention to provide an integral printhead which avoids crosstalk while providing the necessary pixel sharpness and utilizes Organic Light Emitting Diodes (OLED). Other objects of this invention will become apparent hereinafter.

SUMMARY

The present invention achieves the stated object by means of printhead comprising an Organic Light Emitting Diodes (OLED) structure, where the OLEDs emit radiation over a broad range of wavelengths, and color filter arrays, where the printhead is designed for direct printing with the desired pixel sharpness and reduced crosstalk. The OLED structure comprises either actively addressable or passively addressable OLED elements. In all embodiments disclosed, the color filter elements selectively transmit radiation in a different distinct range of wavelengths. In these embodiments, the color filters determine the wavelength range.

In one embodiment, the printhead comprises a transparent substrate having a planar light receiving surface parallel to and opposite to a planar light emitting surface, an OLED structure, comprising at least one array of OLED elements and deposited onto the light receiving surface of the substrate, and at least one of a plurality of elongated arrays of color filter elements deposited on the light emitting surface of the substrate. Two possible different arrangements for the printhead are disclosed. In one arrangement, each color filter array in the printhead comprises at least one of a plurality of triplets of color filters, and each element in each said triplet being capable of transmitting radiation in a distinct wavelength range different from the distinct wavelength range of the other two color filters in the same triplet. In the second arrangement, the printhead comprises at least one of a plurality of triplets of elongated arrays of individually addressable Organic Light Emitting Diode (OLED) elements and of triplets of elongated arrays of color filter elements, each OLED array in the triplet being in effective light transmission relation to the light receiving surface of one color filter array in the triplet thereby constituting an OLED—Color filter array set. Each set in the triplet is aligned in substantially parallel relation to any other set in the triplet. Each color filter array in each triplet has elements that are capable of transmitting radiation in a distinct wavelength range different from the distinct wavelength range of the other two arrays in the triplet.

In another embodiment, the printhead comprises a transparent substrate having a planar light receiving surface parallel to and opposite to a planar light emitting surface, at least one of a plurality of elongated arrays of color filter elements deposited on the light receiving surface of the substrate, and an OLED structure, comprising at least one array of OLED elements and deposited onto the color filter array. Again, the same two alternative arrangements are disclosed for this embodiment.

In a third embodiment, the printhead comprises a substrate having a planar first surface opposite to a planar second surface and an individually addressable Organic Light Emitting Diode (OLED) structure, comprising at least one elongated array of individually addressable Organic Light Emitting Diode (OLED) elements and deposited onto the first surface of the substrate. A substantially transparent layer is deposited onto the OLED structure. The substantially transparent layer has a light receiving surface in effective light transmission relation to the OLED structure, the light receiving surface being located opposite to a light emitting surface. At least one of a plurality of elongated array of color filter elements is deposited onto and in effective light transmission relation to the light emitting surface of the transparent layer. Again, the same two alternative arrangements previously disclosed are applicable for this embodiment.

A fourth embodiment of the printhead comprises a substrate having a planar first surface opposite to a planar second surface, an individually addressable Organic Light Emitting Diode (OLED) structure, comprising at least one elongated array of individually addressable Organic Light Emitting Diode (OLED) elements and deposited onto the first surface of the substrate. At least one of a plurality of elongated array of color filter elements is deposited onto the OLED structure. A substantially transparent layer is deposited onto the color filter array. The substantially transparent layer has a light receiving surface in effective light transmission relation to the color filter array, the light receiving surface being located opposite to a light emitting surface. The same two alternative arrangements previously disclosed are applicable for this embodiment.

The parameters—the distance between color filter elements, the characteristic dimensions of the color filter elements, the distance between the color filter elements and the photosensitive material, and the distance between the OLED elements and the color filter elements are selected to optimize the exposure of the photosensitive material at a given pixel area corresponding to a given color filter array element, due to the light intensity from the elements of the array which are adjacent to said given color filter element and from the given color filter element. An exposure is optimized if the Subjective Quality Factor (SQF) of the resulting pixel is as close to 100 as possible and if the intersection of the normalized intensity profile produced by an adjacent color filter array element at given pixel locations with the normalized intensity profile produced by the corresponding color filter array element is as close to 0.5 as possible.

Imageable materials or colorants can be used to form the color filter elements.

The printheads of this invention can be used to expose the entire gamut of photosensitive materials, for example, silver halide film, photosensitive paper, dry silver, photocopying receptor material, imageable materials comprised of dyes, acid amplifiers and other photosensitive compounds.

These embodiments provide printheads that are light weight and compact, where an OLED structure and color filter array are deposited onto substrates and, the printheads are designed for direct quasi-contact printing, without additional optical elements, with the desired pixel sharpness and reduced crosstalk. By virtue of their compactness and their light weight, as well as the low power requirements of OLED elements, the printheads of this invention enable the construction of portable printing devices for the mobile data environment.

DESCRIPTION OF THE DRAWINGS

The novel features of this invention are set forth in the appended claims. However, the invention will be best understood from the following detailed description when read in connection with the accompanying drawings wherein:

DETAILED DESCRIPTION

To provide a printhead that is light and compact, which is the primary object of this invention, an OLED structure is deposited onto a substrate and the printhead is designed for direct quasi-contact printing with the desired pixel sharpness and reduced crosstalk. In order to achieve this objective, radiation in at least three separate wavelength ranges must be delivered to the medium. In one type of embodiments, both OLEDs emitting over a broad range of wavelengths and color filters are deposited onto the substrate. The color filter elements selectively transmit radiation in a different distinct range of wavelengths. In this embodiment, the color filters determine the wavelength range. Another type of embodiments is disclosed in a related application Ser. No. 09/749,346, filed Dec. 27, 2000.

All embodiments disclosed below meet the objective of providing a compact light weight printhead capable of direct quasi-contact printing and comprise an OLED—Color Filter structure. The OLED—Color Filter structure includes OLED elements emitting radiation over a broad range of wavelengths and color filter elements that selectively transmit radiation in a distinct ranges of wavelengths.

Two classes of embodiments of an OLED—Color Filter structure are presented below. In the first class of embodiments, the OLED—Color Filter structure includes a transparent substrate. In the second class of embodiments, the OLED—Color Filter structure is deposited onto a separate substrate and includes a transparent layer.

OLED—Color Filter Structures Including a Transparent Substrate

Figure 1:
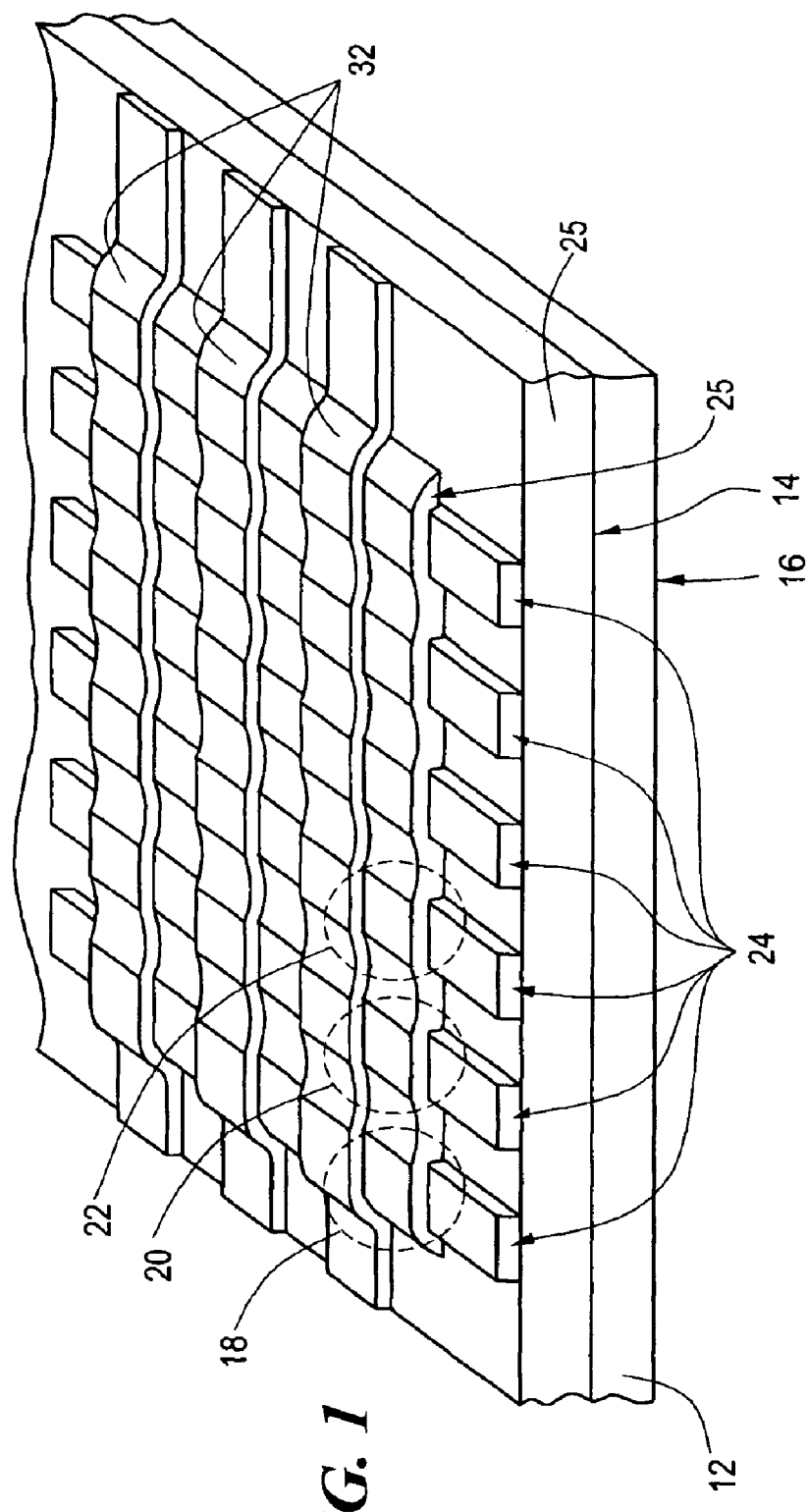
FIG. 1 depicts a graphical representation of the first embodiment of an OLED printhead and illustrates the components of a passively addressable OLED structure.

A graphical representation of one embodiment of this invention is shown in FIG. 1. FIG. 1 illustrates the elements of a printhead typical of this invention. Referring to FIG. 1, a printhead assembly of one embodiment of this invention is shown at 10. As shown in FIG. 1, a substantively transparent substrate 12, having a substantially planar light receiving surface 14 oppositely spaced apart from and substantively parallel to a substantially planar light emitting surface 16, serves as a base on which to deposit the color filter array 80. The color filter array layer 80 is deposited onto and in effective light transmission relation to the light receiving surface 14 of the substrate 12. The color filter elements selectively transmit radiation in a distinct range of wavelengths, and have a substantially planar color filter light receiving surface oppositely spaced apart from and substantively parallel to a substantially planar color filter light emitting surface. The OLED structure 50, comprising arrays 18, 20 and 22 of individually addressable Organic Light Emitting Diode (OLED) elements is deposited (deposition on a substrate includes preparing the surface, by planarizing it or passivating it, if any preparation is needed; passivation could include depositing a very thin layer of another material) onto the color filter light receiving surface. In one embodiment, the OLED structure consists of transparent anode rows 24, organic layers 25 and cathode columns 32. The OLED is energized when a voltage is placed across the anode and cathode terminals. An OLED array is defined by the array of intersections of the anode rows and cathode columns. The OLED arrays 50 emit light (the term "light" is synonymous to radiation) over a broad range of wavelengths, for example, over the entire visible range as a white emitter would. (The term substantively or substantially transparent describes a material that has a substantial transmittance over the broad range of wavelengths of interest, that is, the range of wavelength of OLED emission or all the color filter transmission. For comparison, the typical commercial specification for transparent electrodes requires that two superposed electrodes will have a transmittance of at least 80% at 550 nm.)

Figure 2A:
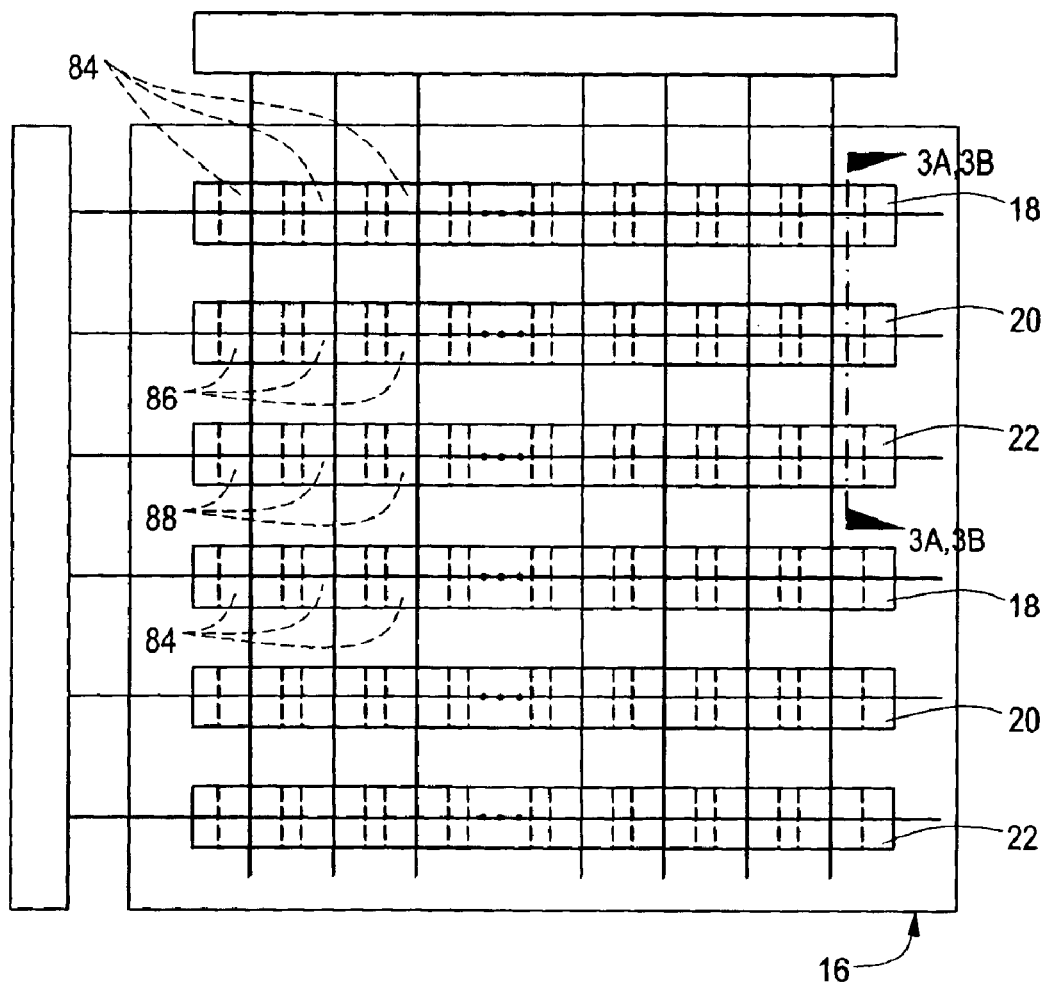
FIG. 2A is a plan view of the first embodiment of an OLED printhead where the printhead comprises a plurality of triplets of array sets where each set comprises an array of OLED elements emitting radiation over a broad range of wavelengths and an array of color filter elements, where the elements in each array in the triplet transmit radiation in one distinct range of wavelengths different from the distinct wavelength range of the other two color filter arrays in the triplet, and the printhead includes a transparent substrate.
Figure 3A:
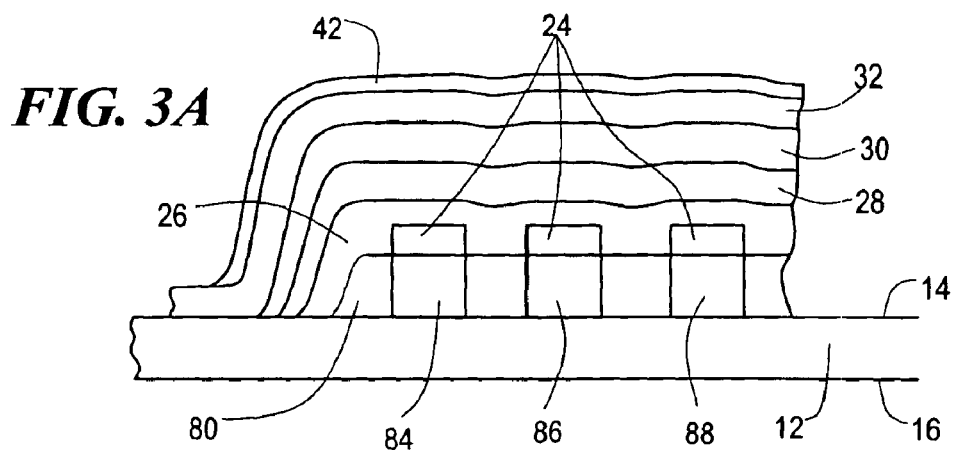
FIG. 3A is a cross-sectional view, for passively addressable OLED structure, across three array sets, where a set comprises an array of OLED elements emitting radiation over a broad range of wavelengths and an array of color filter elements, in the triplet of FIG. 2A and illustrates the components of a passively addressable OLED structure and the color filter arrays in the embodiment in which the color filter elements are deposited onto and in effective light transmission relation to the light receiving surface of the substrate.
Figure 3B:
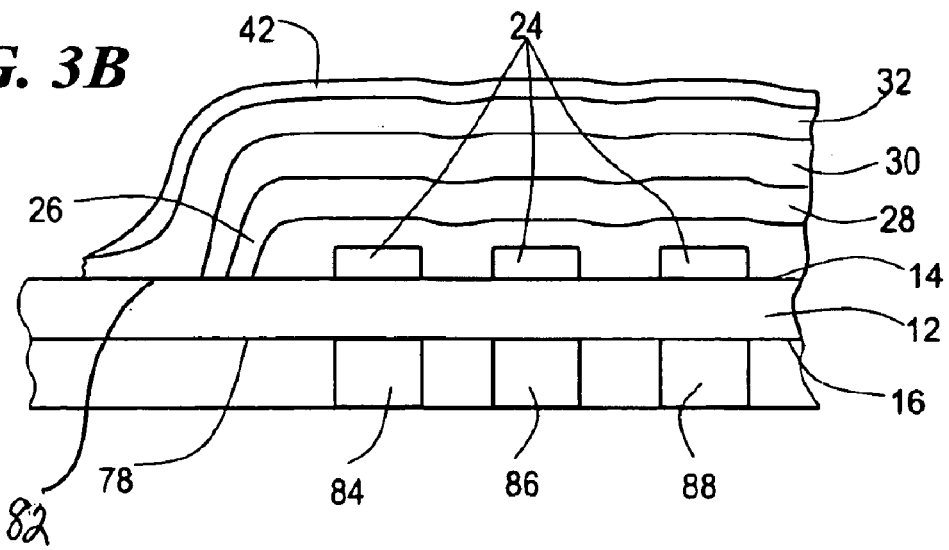
FIG. 3B is a cross-sectional view, for passively addressable OLED structure, across three array sets, where a set comprises an array of OLED elements emitting radiation over a broad range of wavelengths and an array of color filter elements, in the triplet of FIG. 2A and further illustrates the components of a passively addressable OLED structure the color filter arrays in the embodiment in which the color filter elements are deposited onto and in effective light transmission relation to the light emitting surface of the substrate.
Figure 3C:
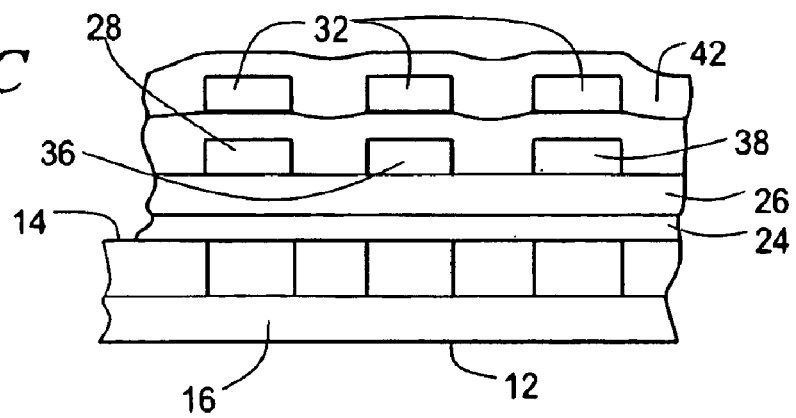
FIG. 3C is a cross-sectional view, for passively addressable OLED structure, along one array set in FIG. 2B and further illustrates the components of a passively addressable OLED structure the color filter arrays in the embodiment in which the color filter elements are deposited onto and in effective light transmission relation to the light receiving surface of the substrate.
Figure 3D:
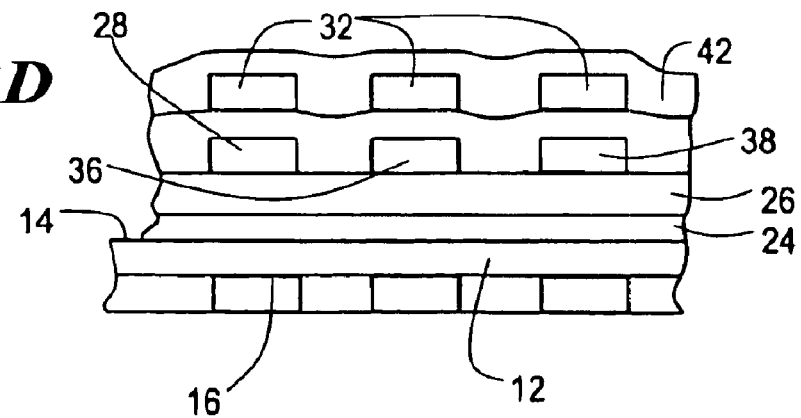
FIG. 3D is a cross-sectional view, for passively addressable OLED structure, along one array set in FIG. 2B and further illustrates the components of a passively addressable OLED structure the color filter arrays in the embodiment in which the color filter elements are deposited onto and in effective light transmission relation to the light emitting surface of the substrate.

The printhead shown in FIG. 2A includes at least one triplet (three) of elongated arrays of individually addressable Organic Light Emitting Diode (OLED) elements 18, 20 and 22 and at least one triplet of elongated arrays of color filters 84, 86 and 88, each OLED array in the triplet in effective light transmission relation to the light receiving surface of one color filter array in the color filter array triplet thereby constituting an OLED—color filter array set. The OLED arrays 18, 20 and 22 emit light (the term "light" is synonymous to radiation) over a broad range of wavelengths, for example, over the entire visible range as a white emitter would. In this configuration it is the color filters that determine the wavelength range (for example red, green or blue) of the radiation emitted by the print head. The color filter arrays can be located directly underneath the OLED arrays (deposited onto the light receiving surface of the substrate, as shown in FIGS. 3A and 3C) or, alternatively, the color filter arrays can be deposited onto the substrate surface opposite to the substrate surface on which the OLED array is deposited (deposited onto and in effective light transmission relation to the light emitting surface of said substrate, as shown in FIGS. 3B and 3D). Referring to FIG. 2A, which is a view of the printhead from the light emitting side 16 of the substrate, color filter arrays 84, 86 and 88 are either deposited onto and in effective light transmission relation to the light receiving surface of the substrate or deposited onto and in effective light transmission relation to the light emitting surface of the substrate. The OLED arrays 18, 20 and 22 are shown in dashed (—) lines underneath the color filters.

Figure 2B:
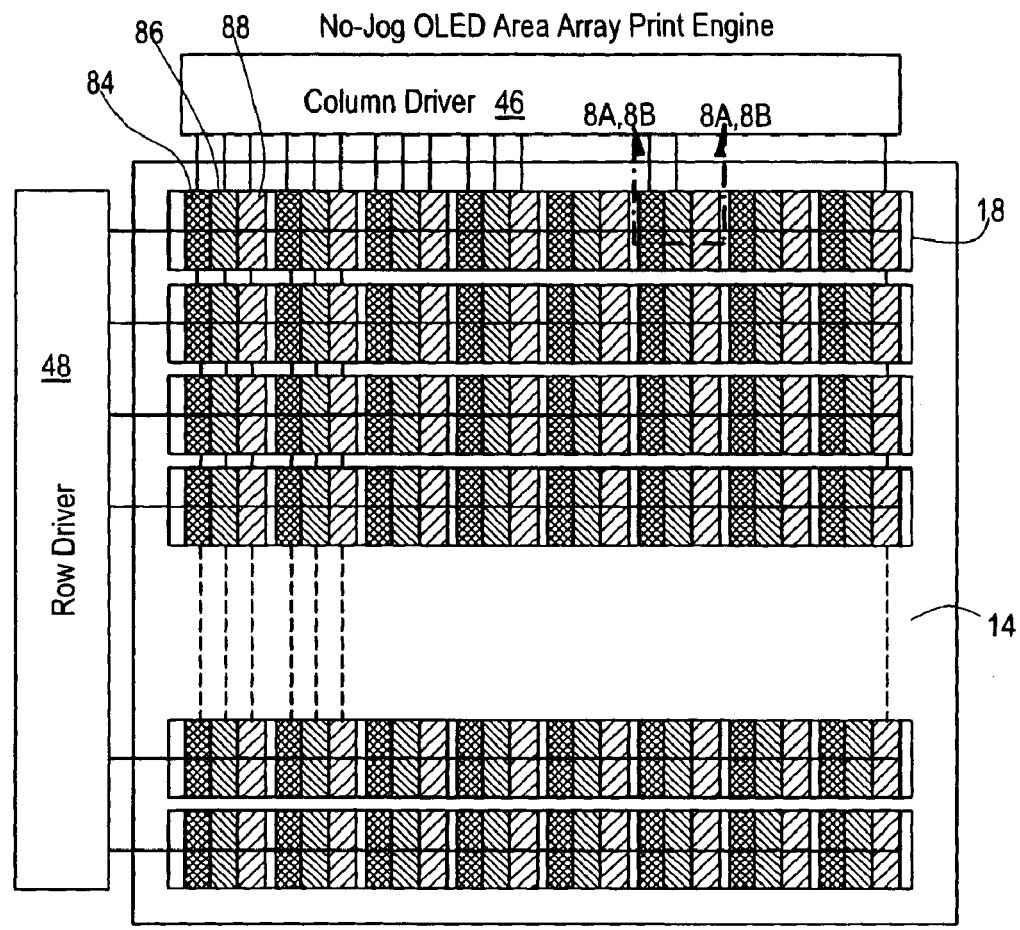
FIG. 2B is a plan view of the second embodiment of an OLED printhead, where the printhead comprises at least one array set, where a set comprises an array of OLED elements emitting radiation over a broad range of wavelengths and an array of color filter elements, and where each color filter array is comprised of a plurality of triplets of color filter elements and each element in each of the triplets transmits radiation in a distinct wavelength range, and the printhead includes a transparent substrate.

An alternative arrangement of this embodiment, shown in FIG. 2B, comprises at least one array of OLED elements and at least one array of color filter elements. The color filter array is comprised of at least one of a plurality of triplets of color filters 84, 86 and 88, and each element in each triplet is capable of transmitting radiation in a distinct wavelength range different from the distinct wavelength range of the other two color filters in the same triplet, (red, green, and blue for example). The cross sectional views for this embodiment are shown in FIGS. 3C and 3D. Comparing FIGS. 3C and 3D with FIGS. 3A and 3B, it can be seen that the most significant difference is the orientation of the cathode and anode electrodes.

The anode rows and cathode columns of the OLED arrays, in either FIG. 2A or FIG. 2B, can, in one embodiment, be extended beyond the OLED structure in order to constitute conductive interconnecting lines. In that embodiment, the driver control circuits 46 and 48 for selectively controlling the energizing of said Organic Light Emitting Diode (OLED) elements are connected to the row and column electrodes by electrical connection means such as elastomer connectors (sometimes called "zebra links"; commercial examples are L type connectors from Potent Technology Inc. and "G" type connectors from ARC USA/ GoodTronic Corporation). Other electrical connection means for selective connection of the individually addressable light emitting elements to the driver circuits are conductive interconnecting lines. The conductive interconnecting lines are selectively deposited on the light receiving surface of the substrate in a manner whereby they provide connecting means. If conductive interconnecting lines are used, the driver control circuits 46 and 48 are connected by means, such as wire bonding or solder bumping, to selected ones of the conductive interconnecting lines. The driver control circuits could be mounted on the light receiving surface of the substrate 14, or could be located elsewhere. If mounted elsewhere the connection means will also include electrical leads and connectors as is well known to those schooled in the art. The conductive interconnecting lines can be connected to the individually addressable OLED elements either by means of the deposition process or by wire bonding or solder bumping. It should also be apparent to those skilled in the art that it is possible to extend and position the electrodes from the rows and columns to constitute the conductive interconnecting lines.

The OLED is energized when a voltage is placed across the anode and cathode terminals. In analogy to liquid crystal displays, it is possible to construct both actively addressable and passively addressable OLEDs. In an actively addressable OLED structure, there is additional circuitry that allows selecting an element in the structure. Referring to FIG. 1, for passively addressable OLEDs, the OLED structure consists of transparent anode rows 24, organic layers 25 and cathode columns 32. Referring to FIGS. 2A and 2B, the driver control circuits 46 and 48 for selectively controlling the energizing of said Organic Light Emitting Diode (OLED) elements are connected to the row and column electrodes. The driver control circuits 46 are connected to the column electrodes of OLED. The driver control circuits 48 are connected to the row electrodes of OLED arrays.

Figure 4:
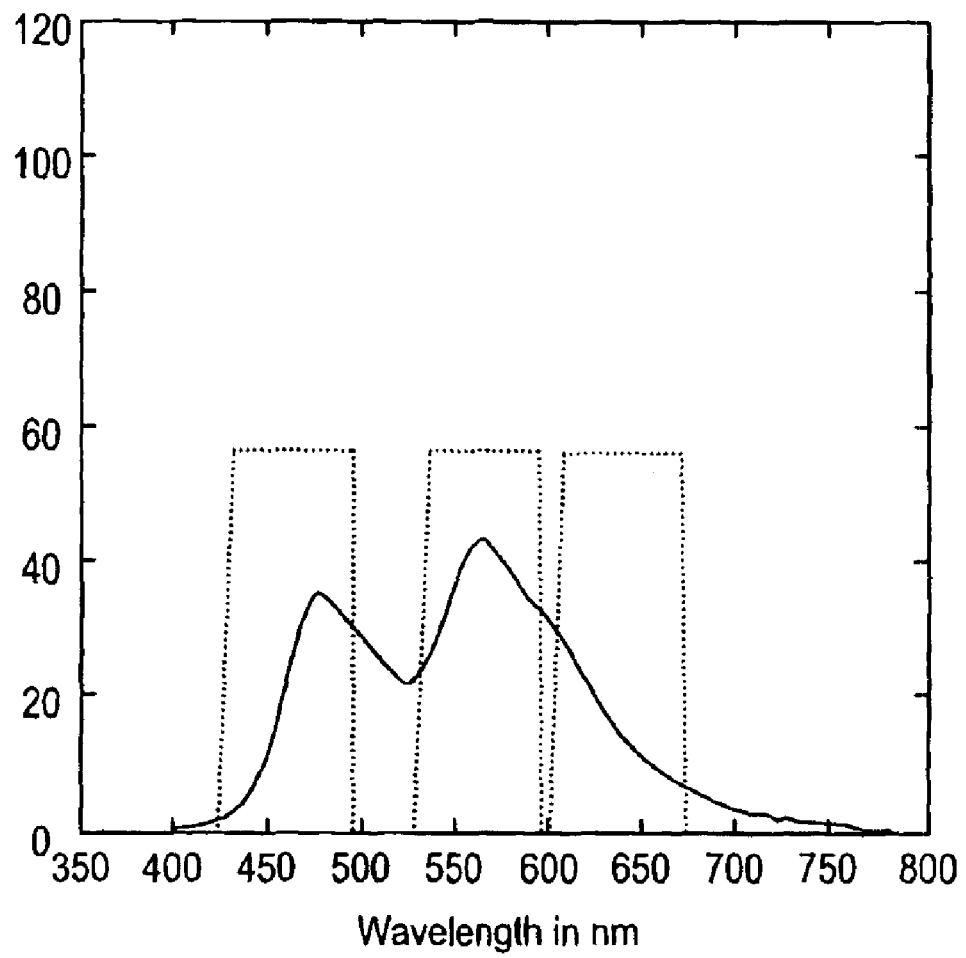
FIG. 4 depicts the transmittance of typical ideal bandpass color filters (with 50% transmission) as a function of wavelength.

A cross sectional view across the three OLED and color filter arrays in FIG. 2A, depicting one element in each array, shown in FIGS. 3A and 3B, is more illustrative of the embodiment shown in FIG. 2A. Referring to FIG. 3A, which illustrates the passively addressable case, the three color filter elements 84, 86 and 88 are deposited onto and in effective light transmission relation to the light receiving surface of the substrate. Shown in FIG. 3B is the alternate configuration, in which the color filter elements 84, 86 and 88 are deposited onto and in effective light transmission relation to the light emitting surface of the substrate. Each color filter elements selectively transmits radiation in a different distinct range of wavelengths, for example, red, green and blue. (The transmittance of typical ideal bandpass color filters as a function of wavelength is shown in FIG. 4). Among the techniques that can be used to deposit color filters are the use of photoresist and deposition of organic pigments by vacuum evaporation followed by conventional photolithographic lift-off techniques. Other techniques that can be used to deposit color filters are thermal printing, and depositing an imageable layer. Each color filter is formed from at least one color filter material. In one embodiment, as already stated, the color filter material is an imageable material. The imageable material is coated onto the light receiving surface of the substrate, as in the configuration shown in FIG. 3A, or is coated onto the light emitting surface of the substrate as shown in FIG. 3B. Examples of imageable materials suitable for constructing color filters are those materials described in U.S. Pat. Nos. 4,602,263; 4,720,449; 4,720,450; 4,745,046; 4,818,742; 4,826,976; 4,839,335; 4,894,358, 4,960,901, 5,582,956; 5,621,118; and 6,004,719. If an imageable layer that is capable, upon exposure, of forming three colors is not transparent in its unexposed form or can be imaged to create a black layer, it is possible to form black grid lines to separate adjacent filter elements. These black grid lines comprise a region substantially adjoining the entire periphery of the color filter and aid in the reduction of crosstalk.

The color filter layer 80 has a substantially planar light receiving surface 78 oppositely spaced apart from and substantially parallel to a substantially planar light emitting surface 82. For the configuration of FIGS. 3A and 3C, the color filter light emitting surface is in effective light transmission relation to the light receiving surface of the substrate. For the configuration of FIGS. 3B and 3D the color filter light receiving surface is in effective light transmission relation to the light emitting surface of the substrate. (In both cases the color filter element is in effective light transmission relation to an OLED element that is the primary light source.) If an imageable layer is used as the color filter material, the color filters are formed by exposing either the light receiving surface or the light emitting surface of the imageable material with at least one source of radiation, the at least one source of radiation emitting over at least one distinct range of wavelengths. The exposure is performed so as to produce one or many elongated array of color filter elements at one color or distinct range of wavelengths.

Other suitable color filter materials are colorant (dyes) where the colorants are deposited by thermal mass transfer, printing or other deposition technique, such as vapor deposition. In one method of defining the color filter elements, a second material has to be used to provide recesses to define the color filters. Definition of the recesses is usually done using photoresist and techniques known to those skilled in the processing art. Another suitable method of defining the color filter elements is to deposit colorant and remove the excess colorant. Removal of the unwanted materials, whether photoresist or colorant, is usually performed by lift-off processes.

The color filter material surface may need to be prepared (passivated) for deposition of the first electrode in the OLED array structure. In the configuration of FIG. 3A, a material such as indium tin oxide (ITO) which is a transparent conductor, or a combination of a layer of high refractive index material, a conductive layer, and another high index layer (for example, ITO, silver or silver/gold, and ITO as described in WTO publication WO 99/36261), is deposited onto the prepared color filter material surface by vacuum deposition techniques such as sputtering or evaporation. In the configuration of FIG. 3B, a material such as Indium tin oxide which is a transparent conductor, or a combination of layer of high refractive index material, a conductive layer, and a high index layer (for example, ITO, silver or silver/gold, and ITO as described in WTO publication WO 99/36261), is deposited onto the substrate's light receiving surface by vacuum deposition techniques such as sputtering or evaporation. (The above discussion also applies to FIGS. 3C and 3D since these two FIGS. differ structurally from FIGS. 3A and 3B only in the orientation of the cathode and anode electrodes.)

Referring again to FIGS. 3A, 3B, 3C and 3D the hole transport layer 26 is deposited on the transparent electrode 24. Then, electroluminescent layer 28 and an electron transport layer 30 are deposited on the hole transport layer 26. Since all OLED elements emit at the same broad range of wavelengths, the electroluminescent layer can be deposited continuously and is the same for all OLED elements. Since the radiation emission areas are defined by the color filters, these organic layers do not need to be patterned into arrays. A cathode structure 32 is deposited next using vacuum deposition techniques. For a passive addressing OLED printhead the cathode structure is a conductive material structure such as a magnesium silver alloy layer and silver layer or metals such as silver, gold, aluminum, copper, calcium, magnesium or a combination thereof. The conductive material 32 in FIG. 2 forms a column electrode. For an active addressing OLED printhead a structure consisting of a conductive material and a transistor switch (at least two transistors and a capacitor) at each element is required. Finally, a protective coating 42 is deposited by any of a variety of means (similar to the organic layers).

Any color filter element in the array has characteristic surface dimensions which are substantially the same for all color filter elements in the array and from which a center point can be defined. It is possible to define, for each center point, an image point at the opposite color filter surface. The image point is located along a line passing through the center point and perpendicular to the surface on which the center point is located. The color filter center point, the image point and the line connecting them define points and an axis used for alignment.

The anode and the cathode define an OLED element that has a characteristic surface dimensions which are substantially the same for all OLED elements and from which a center point can be defined. In one method of alignment, during deposition, the OLED center points are used in conjunction with the color filter center points, the respective color filter image points and the lines connecting the color filter center points and the respective color filter image points to ensure that OLED center points are simultaneously substantially collinear with the corresponding image points of said color filter center points (that is, the OLED elements are aligned with the respective color filter elements). Other alignment techniques known to those skilled in the material processing and deposition art can be used.

OLED—Color Filter Structure on a Separate Substrate

Other embodiments are shown in FIGS. 5A, 5B, 6A, 6B, 6C, 6D, 6E, 6F, 6G and 6H. FIGS 5A, 5B, 6A, 6B, 6C, 6D, 6E, 6F, 6G and 6H include a substrate having a substantially planar first surface oppositely spaced apart from a substantially planar second surface and an individually addressable Organic Light Emitting Diode (OLED) structure. In the embodiment shown in FIGS. 6A, 6B, 6C and 6D, a substantially transparent layer is deposited onto the OLED structure. The substantially transparent layer has a light receiving surface in effective light transmission relation to the transparent anode; the light receiving surface is oppositely spaced apart from a light emitting surface. A color filter material is deposited onto the light receiving surface of the transparent layer.

In the embodiment shown in FIGS. 6E, 6F, 6G and 6H, at least one of a plurality of elongated array of color filter elements, having a substantially planar color filter light receiving surface oppositely spaced apart from and substantively parallel to a substantially planar color filter light emitting surface, deposited onto the OLED structure and a substantively transparent layer is deposited onto the at least one of a plurality of elongated array of color filter elements. Referring to FIGS. 5A, 5B, 6A, 6B, 6C, 6D, 6E, 6F, 6G and 6H, a substrate 52 having a substantially planar first surface 54 oppositely spaced apart from a substantially planar second surface 56 serves a base on which to deposit an actively addressable Organic Light Emitting Diode (OLED) structure, the OLED structure comprising at least one elongated array of individually addressable Organic Light Emitting Diode (OLED) elements 18. For an actively addressable OLED structure, these elements include a transistor switch (the transistor switch comprising a plurality of transistors and a capacitor) 58, at least one planarizing layer 60, a plurality of contact pads and electrical busses 62. Both types of OLED structures include a cathode 64, a plurality of layers of organic materials, and a transparent anode 24. For actively addressable OLED structures, the transistor switch 58 is deposited in the closest proximity to the first surface 54. For passively addressable OLED structures, the cathode 64 is deposited in the closest proximity to the first surface 54. For both passively addressable and actively addressable structures, referring to FIGS. 6A, 6B, 6C, 6D, 6E, 6F, 6G and 6H, the transparent anode is deposited in the farthest separation from the first surface; and, a substantively transparent layer 66 is deposited onto the OLED structure.

Referring to FIGS. 6A, 6B, 6C and 6D, the transparent layer 66 has a light receiving surface 68 in effective light transmission relation to the transparent anode 24, and, the light receiving surface 68 is oppositely spaced apart from a light emitting surface 70. The color filter material is deposited onto the light receiving surface of the transparent layer.

Referring to FIGS. 6E, 6F, 6G and 6H, the color filter material is deposited onto the transparent anode in the OLED structure. A transparent layer is deposited onto the color filter array. The transparent layer 66 has a light receiving surface 68 in effective light transmission relation to the color filter array, and, the light receiving surface 68 is oppositely spaced apart from a light emitting surface 70.

Figure 5A:
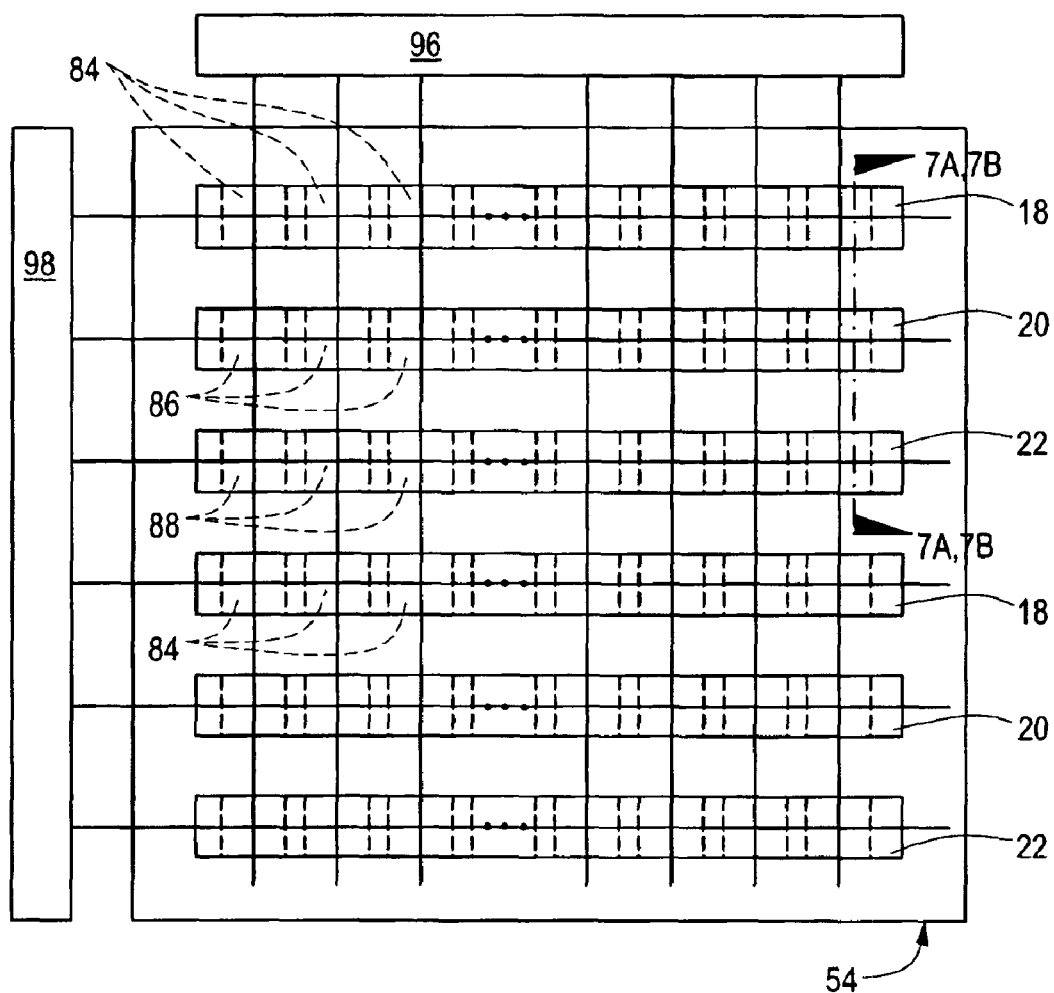
FIG. 5A is a plan view of the another embodiment of an OLED printhead where the printhead comprises a plurality of triplets of array sets where each set comprises an array of OLED elements emitting radiation over a broad range of wavelengths and an array of color filter elements, where the elements in each array in the triplet transmit radiation in one distinct range of wavelengths different from the distinct wavelength range of the other two color filter arrays in the triplet, and the printhead includes a substrate and a transparent layer.

The printhead shown in FIG. 5A includes at least one triplet (three) of elongated arrays of individually addressable Organic Light Emitting Diode (OLED) elements 18, 20, and 22 and elongated arrays of color filters 92, 94 and 96, each OLED array in the triplet in effective light transmission relation to the light receiving surface of one color filter array in the triplet thereby constituting an OLED color filter array set. This structure is further defined in FIGS. 6A, 6B, 6E, and 6F.

Figure 5B:
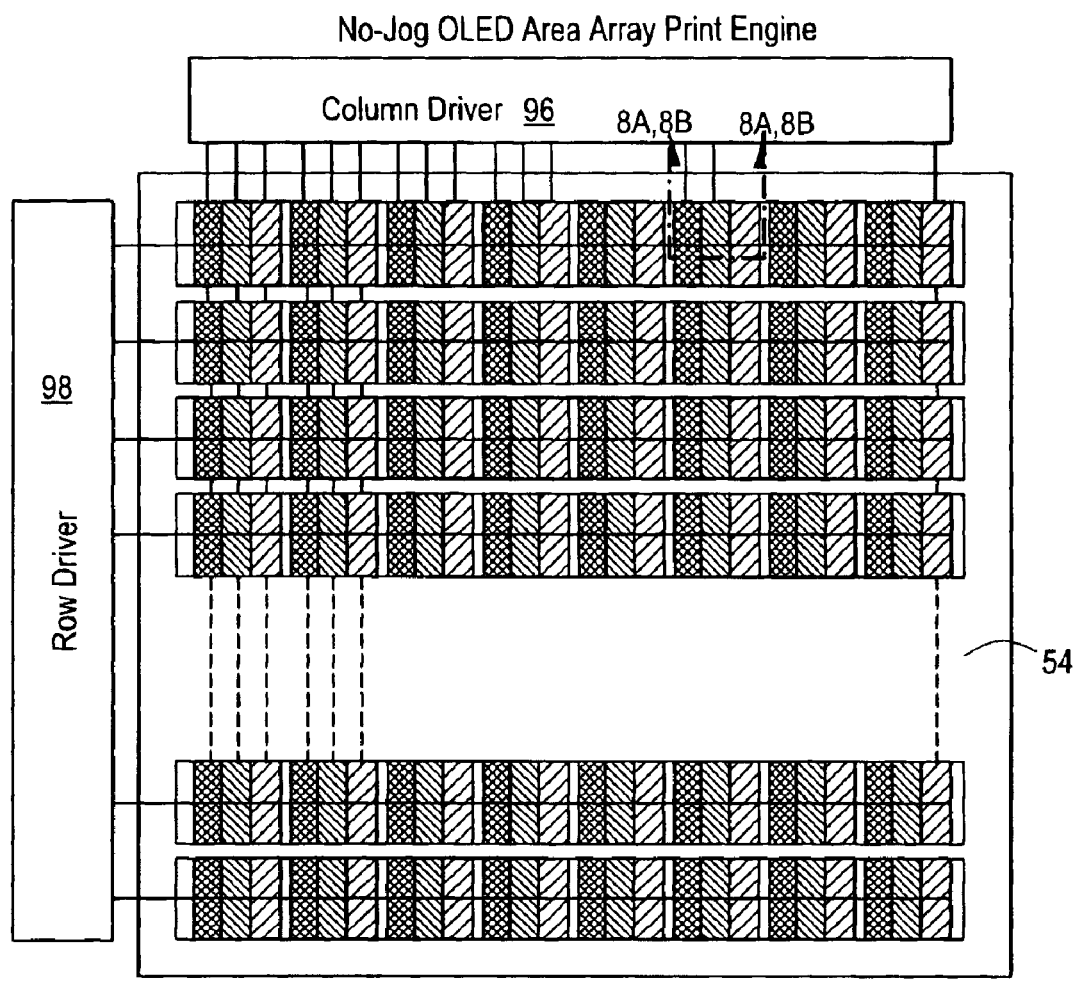
FIG. 5B is a plan view of the second embodiment of an OLED printhead, where the printhead comprises at least one array set, where a set comprises an array of OLED elements emitting radiation over a broad range of wavelengths and an array of color filter elements, and where each color filter array is comprised of a plurality of triplets of color filter elements and each element in each of the triplets transmits radiation in a distinct wavelength range, and the printhead includes a substrate and a transparent layer.
Figure 6A:
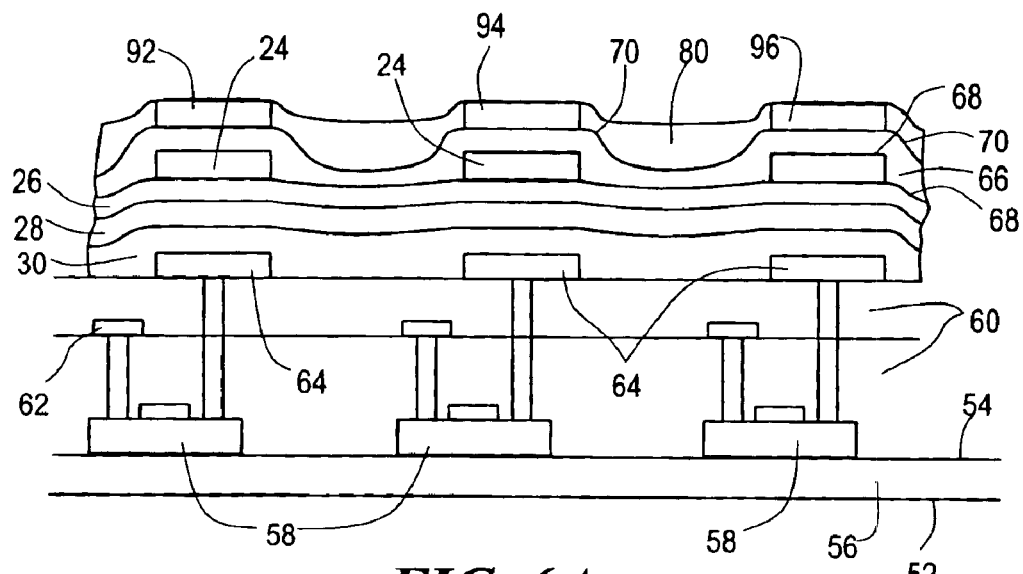
FIG. 6A is a cross-sectional view, for an actively addressable OLED structure, across three arrays and the underlying OLED structure in the triplet of FIG. 5A and illustrates the components of an actively addressable OLED Structure and the color filter arrays for the configuration in which the color filter arrays are deposited onto the light emitting surface of the transparent layer.
Figure 6B:
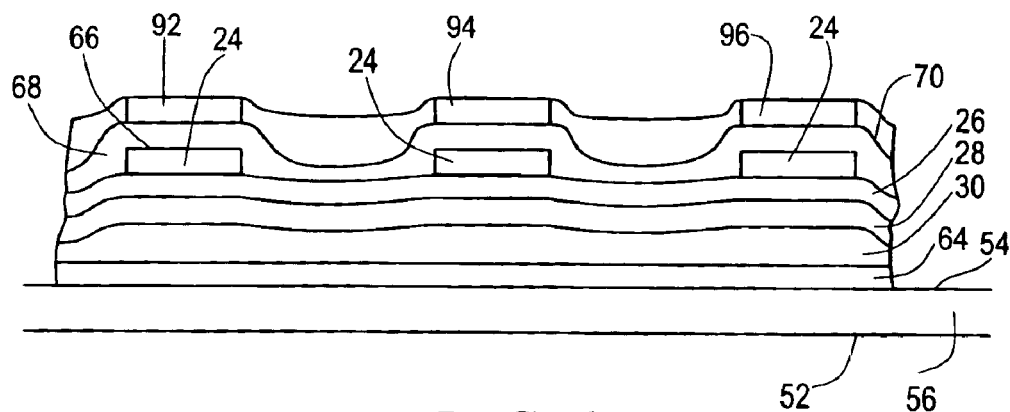
FIG. 6B is a cross-sectional view, for passively addressable OLED structure, across three arrays and the underlying OLED structure in the triplet of FIG. 5A and illustrates the components of a passively addressable OLED structure and the color filter arrays for the configuration in which the color filter arrays are deposited onto the light emitting surface of the transparent layer.
Figure 6C:
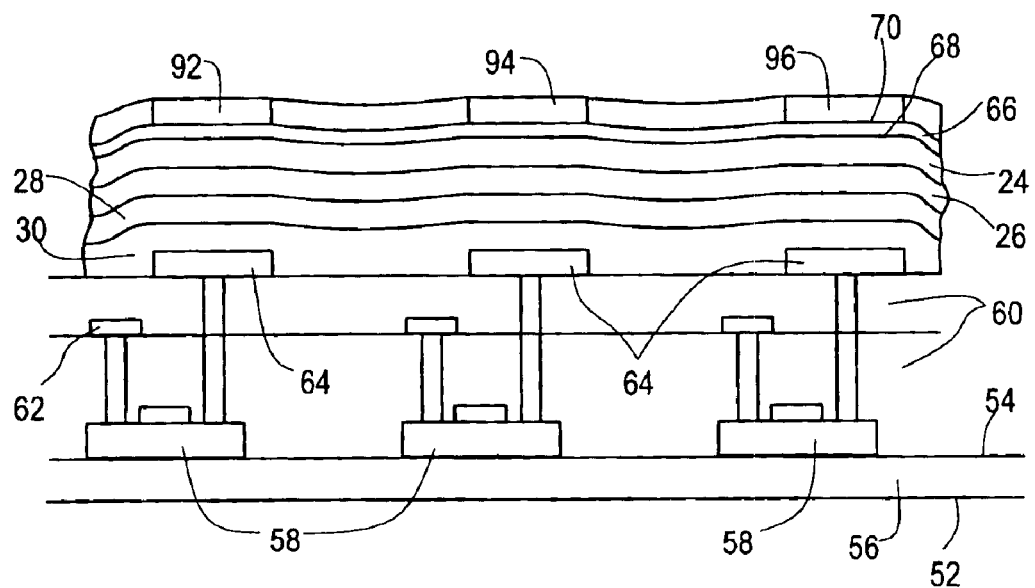
FIG. 6C is a cross-sectional view, for actively addressable OLED structure, along one array set in FIG. 5B and further illustrates the components of an actively addressable OLED structure and the color filter arrays for the configuration in which the color filter arrays are deposited onto the light emitting surface of the transparent layer.
Figure 6D:
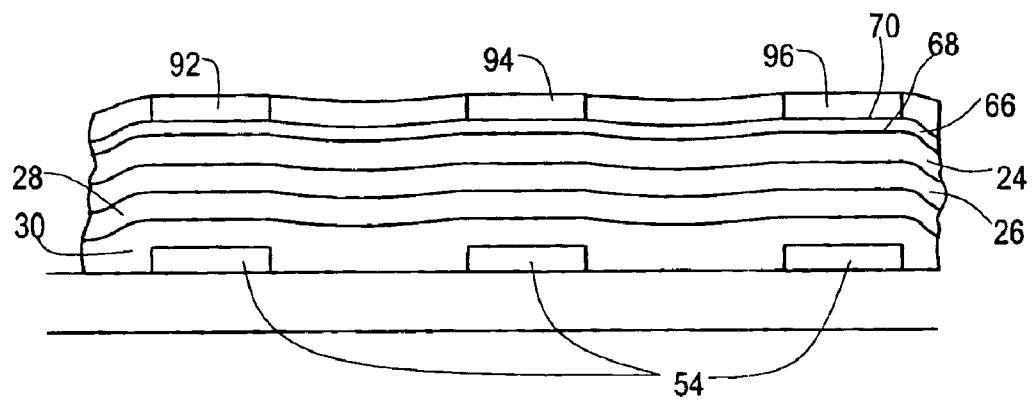
FIG. 6D is a cross-sectional view, for passively addressable OLED structure, along one array set in FIG. 5B and further illustrates the components of a passively addressable OLED structure and the color filter arrays for the configuration in which the color filter arrays are deposited onto the light emitting surface of the transparent layer.
Figure 6E:
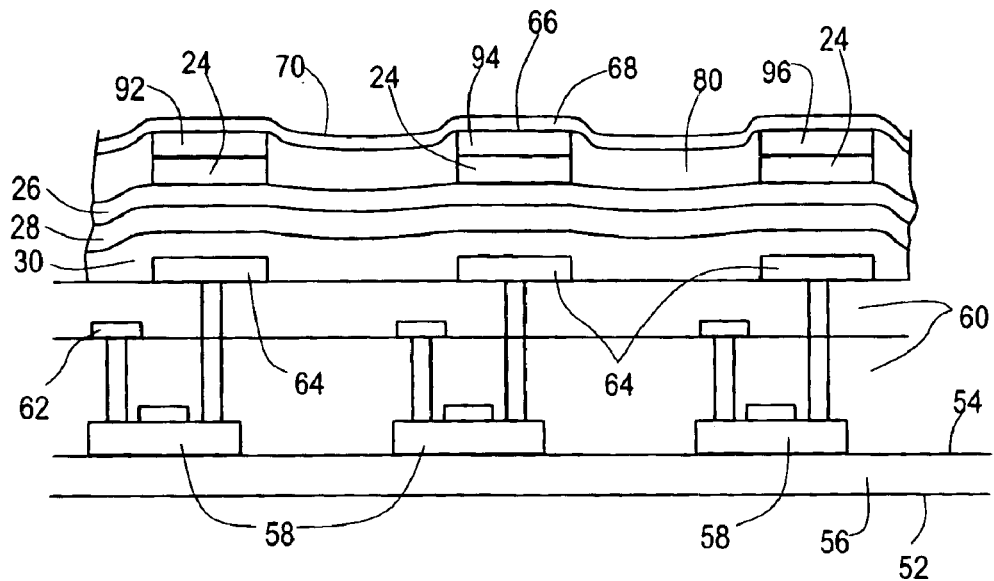
FIG. 6E is a cross-sectional view, for an actively addressable OLED structure, across three arrays and the underlying OLED structure in the triplet of FIG. 5A and illustrates the components of an actively addressable OLED structure and the color filter arrays for the configuration in which the color filter arrays are deposited onto the OLED structure.
Figure 6F:
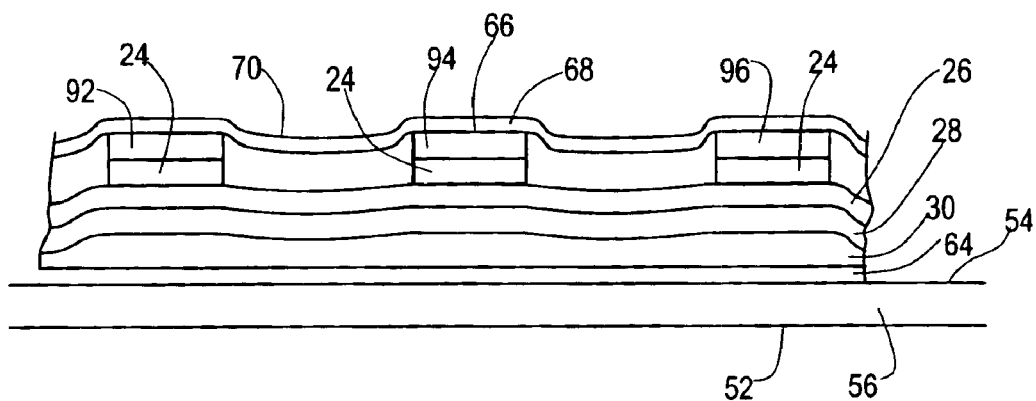
FIG. 6F is a cross-sectional view, for passively addressable OLED structure, across three arrays and the underlying OLED structure in the triplet of FIG. 5A and illustrates the components of a passively addressable OLED structure and the color filter arrays for the configuration in which the color filter arrays are deposited onto the OLED structure.
Figure 6G:
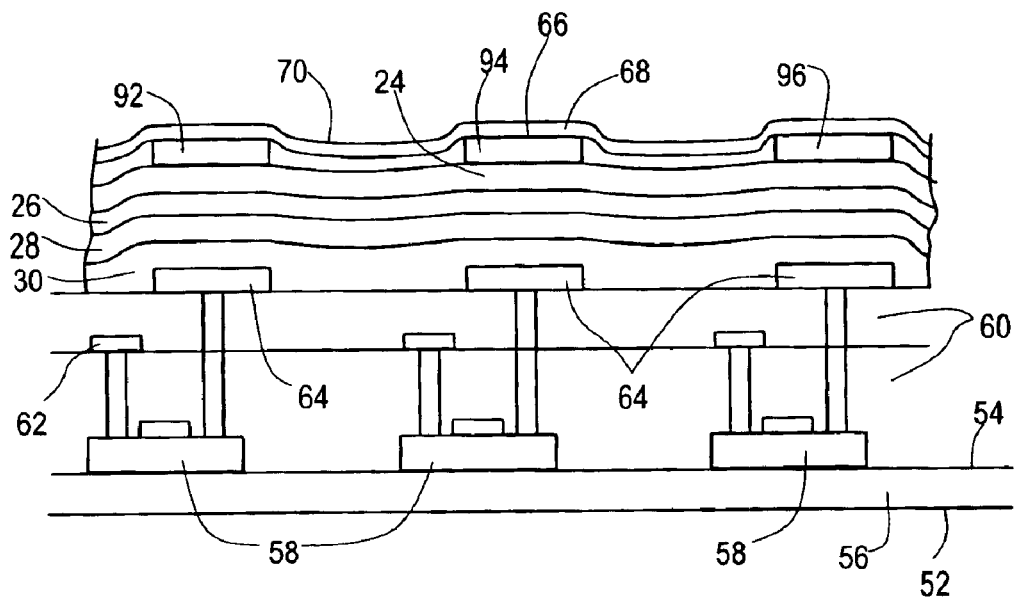
FIG. 6G is a cross-sectional view, for actively addressable OLED structure, along one array set in FIG. 5B and further illustrates the components of an actively addressable OLED structure and the color filter arrays for the configuration in which the color filter arrays are deposited onto the OLED structure.
Figure 6H:
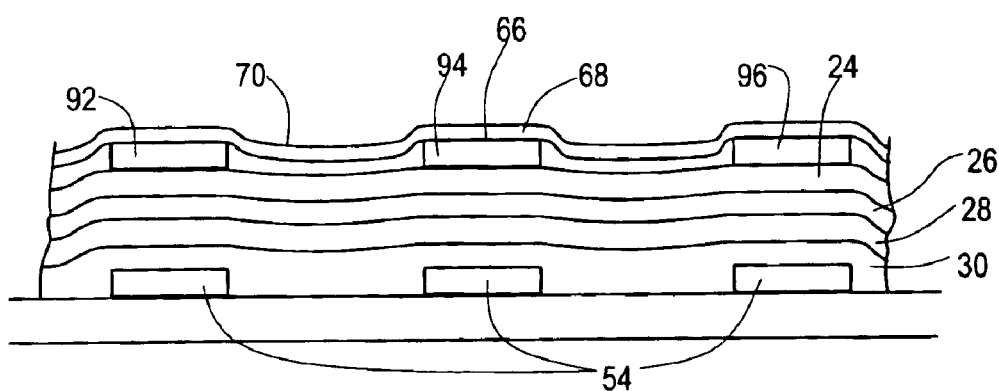
FIG. 6H is a cross-sectional view, for passively addressable OLED structure, along one array set in FIG. 5B and further illustrates the components of a passively addressable OLED structure and the color filter arrays for the configuration in which the color filter arrays are deposited onto the OLED structure.

In another arrangement, shown in FIG. 5B, the printhead consists of at least one OLED array and at least one color filter array; and, the color filter array is comprised of at least one of a plurality of triplets of color filters 92, 94 and 96, and each element in each triplet is capable of transmitting radiation in a distinct wavelength range different from the distinct wavelength range of the other two color filters in the same triplet (red, green, and blue for example). This structure is further defined in FIGS. 6C, 6D, 6G, and 6H.

Referring to FIGS. 6A, 6C, 6E and 6G, specific to actively addressable OLED structures, a substrate 52 serves as a base on which to deposit an actively addressable Organic Light Emitting Diode (OLED) structure. The substrate material could be glass, a plastic substrate suitable for deposition, amorphous silicon or a semiconductor wafer. The transistor switch 58 is deposited on the first surface 54 of the substrate 52. (FET transistor switches are well-known to those skilled in the art. Inuka et al. have shown a transistor switch configuration in the Sid 00 Digest, p. 924. It should be apparent to those skilled in the art how to modify that switch in order to connect the cathode to the transistor.). A planarizing layer 60 separates the transistor switch from the busses and contact pads 62 and the busses and contact pads 62 from the cathode structure 64. The planarizing layer could be constructed out of a material like silicon oxide ($SiO_2$) and the cathode structure is a conductive material structure with the appropriate work function such as a magnesium silver alloy layer and silver layer or metals such as silver, gold, aluminum, copper, calcium, magnesium or a combination thereof deposited using vacuum deposition techniques.

For passively addressable OLED structures, shown in FIGS. 6B, 6D, 6F and 6H a cathode structure 64 is deposited on the first surface 54 of the substrate. (As will be readily understood, deposition on a substrate could also include preparing the surface by planarizing it or passivating it.)

Referring again to FIGS. 6A, 6B, 6C and 6D, the organic layers 26, 28 and 30 are deposited next. An electron transport layer 30, which is common to the arrays emitting at all three wavelengths, is deposited first. Then, an electroluminescent layer 28 is deposited for each array. The OLED elements emit light (radiation) over a broad range of wavelengths, for example, white light, and, therefore, the electroluminescent layer is continuous. It is possible to combine the electroluminescent layer and the electron transport layer into one layer. In this case, layer 30 is absent. Next, a hole transport layer 26 is deposited.

Finally, a transparent conducting layer 24 which serves as an anode is deposited. The anode layer consists of a material such as indium tin oxide, which is a transparent conductor, or a combination of layer of high refractive index material, a conductive layer, and a high index layer (for example, ITO, silver or silver/gold, and ITO as described in WTO publication WO 99/36261), and is deposited by vacuum deposition techniques such as sputtering or evaporation. In order to create the row pattern, techniques well known to those skilled in the art, such as photoresist and etching techniques, are used to remove the excess material. Referring to FIGS. 6A, 6B, 6C and 6D, a substantially transparent layer is deposited next. This transparent layer could be acrylic or polycarbonate or another soluble transparent polymer and can be deposited by techniques such as coating or spin coating. The printhead of FIGS. 5A, 5B, and 6A, 6B, 6C and 6D further comprises at least one of a plurality of elongated array of color filter elements 92, 94 and 96, where the color filter elements selectively transmit radiation in a distinct range of wavelengths. For printhead of FIGS. 5A, 5B and FIGS. 6E, 6F, 6G and 6H, at least one of a plurality of elongated array of color filter elements 92, 94 and 96 is deposited onto the transparent anode, where the color filter elements selectively transmit radiation in a distinct range of wavelengths; then, a transparent layer is deposited. As previously described, the color filter center points, the color filter image points and the lines connecting the color filter center points and the respective color filter image point can be identified and similarly, for the OLED elements, a characteristic surface dimensions, which are substantially the same for all OLED elements and from which a center point can be defined, can be identified. Thus, it is possible to ensure that OLED center points are simultaneously substantially collinear with the corresponding image points of said color filter center points (that is, the OLED elements are aligned with the respective color filter elements). Other alignment techniques known to those skilled in the material processing and deposition art can be used.

It is possible to construct an actively addressable structure with a transparent cathode. In that case (not shown), the transistor switch is deposited in the closest proximity to the first surface, the anode is deposited next, the organic layers are then deposited in reverse order from those of FIGS. 6A, 6B, 6C, 6D, 6E, 6F, 6G and 6H. That is, the hole transport layer is deposited onto the anode, followed by the electroluminescent layer, and, finally an electron transport layer. A transparent cathode is then deposited. A transparent cathode consists, for example, of a thin layer of a conductive material structure of appropriate work function such as a magnesium silver alloy or magnesium layer followed by a layer of a transparent conductive material such as indium tin oxide (ITO) (see WTO publication WO 99/20081 A2 and WTO publication WO 98/061122 A1 and references therein).

Referring to FIGS. 5A, 5B, 6A, 6B, 6C, 6D, 6E, 6F, 6G and 6H, the anode rows and the busses, in the case of actively addressable OLED structures, or the cathode columns, in the case of passively addressable OLED structures, can, in one embodiment, be extended beyond the OLED structure in order to constitute conductive interconnecting lines. In that embodiment, the driver control circuits 90 and 98 for selectively controlling the energizing of said Organic Light Emitting Diode (OLED) elements are connected to the row electrodes and busses by electrical connection means such as elastomer connectors (sometimes called "zebra links"). Additional electrical connection means for selective connection of the individually addressable light emitting elements to the driver circuits are conductive interconnecting lines. If conductive interconnecting lines are used, the conductive interconnecting lines are selectively deposited on the first surface of the substrate in a manner whereby the conductive interconnecting lines provide for selective connection to the individually addressable light emitting elements. If conductive interconnecting lines are used, the driver control circuits 90 and 98 are connected by electrical connection means, such as wire bonding or solder bumping, to selected ones of the conductive interconnecting lines. (The driver control circuits could be mounted on the first surface of the substrate 54, or could be located elsewhere if mounted elsewhere the connection means will also include electrical leads and connectors as is well known to those schooled in the art.) The conductive interconnecting lines are connected to the individually addressable OLED elements either by means of the deposition process or by wire bonding or solder bumping. It should also be apparent to those skilled in the art that it is possible to extend and position the electrodes from the rows and busses to constitute the conductive interconnecting lines.

Referring again to FIGS. 2A and 5A, each the FIG. depicts at least one of a plurality of triplets of elongated arrays of individually addressable Organic Light Emitting Diode (OLED) elements 18, 20 and 22 and elongated arrays of color filters (84, 86 and 88 in FIG. 2A or 92, 94 and 96 in FIG. 5A), each OLED array in the triplet in effective light transmission relation to the light receiving surface of one color filter array in the triplet thereby constituting an OLED color filter array set, where each set in the triplet is aligned in substantially parallel spaced relation with respect to each other set in the triplet, where each color filter array in each triplet is capable of transmitting radiation in a distinct wavelength range different from the distinct wavelength range of the other two arrays in the triplet (for example, red, green, and blue), and where each triplet is aligned in substantially parallel spaced relation with respect to any other triplet. This printhead configuration of either FIG. 2A or 5A, when it comprises only one triplet of sets of arrays, would enable the exposing of a photosensitive material one line at a time. When the configuration shown in either FIG. 2A or 5A comprises many triplets of arrays, it would enable exposing an area.

Exposing a photosensitive material with the printhead of either FIG. 2A or 5A occurs in the following manner. The printhead is placed over the photosensitive material such that the planar light emitting surface of the substrate is oppositely spaced apart at a given distance from and substantively parallel to the light receiving surface of the photosensitive material. In the passive addressing mode as would be the case for printing on highly sensitive instant silver halide film, one row at a time is addressed and printed before multiplexing to the next row. In the active addressing mode, all rows are addressed and printed at the same time. At the completion of addressing and printing all the rows, the printhead is moved one row relative to the film plane and the addressing and printing process repeated with new data. This shifting and printing operation is repeated one more time such that every image pixel in the frame can be exposed to red, green and blue light (either FIG. 2A or 5A). The total print time, for an area exposure and passive addressing, is dependent on print size and is equal to the number of rows times the sum of the exposure time for each color plus the short time to move the print engine one row, twice. In the active addressing mode, where each element has a transistor switch (two transistors and a capacitor), it is possible to energize all the OLEDs at the same time. In this case the total print time is independent of print size and, for an area exposure, is equal to three times the longest exposure time plus, again, the time to move the print engine (or the film) one row, twice.

In the embodiment shown in either FIG. 2B or 5B, each color filter array is comprised of a plurality of triplets of color filter elements, and each element in each said triplet is capable of transmitting radiation in a distinct wavelength range different from the other two elements in the same triplet (red, green, and blue for example). Each of the FIGS. depicts at least one of a plurality of elongated arrays of individually addressable Organic Light Emitting Diode (OLED) elements 18 and at least one elongated array of color filters with at least one triplet of color filter elements 84, 86 and 88. The printhead of either FIG. 2B or 5B would not require moving one row relative to the film plane and repeating the addressing and printing process with new data. In the passive addressing mode, the total print time, for an area exposure, is dependent on print size and is equal to the number of rows times the longest exposure time for any wavelength range. In the active addressing mode, the total print time is independent of print size and, for an area exposure, is equal to the longest exposure time.

Optimizing the Printhead Dimensions

In the above described embodiments of the printhead, the radiation emanating from any color filter in any color filter array and impinging on the light receiving surface of the photosensitive material defines a pixel area, with a characteristic pixel dimension, on the light receiving surface of the photosensitive material. For a given distance between the planar light emitting surface of the printhead facing the photosensitive material and the light receiving surface of photosensitive material, the spacing between centers of the color filters, the characteristic surface dimension of the color filters, the distance between the OLED light emitting surface and the light receiving surface of the color filter material, and the distance between the light emitting surface and the light receiving surface of the substrate in one class of embodiments (or the transparent layer, in the other class of embodiments) are jointly selected so that, at a given pixel area, the pixel area corresponding to a given color filter in a given array, the exposure of the photosensitive material due to the light intensity from the elements of the given array which are adjacent to the given element, is optimized and adequate pixel sharpness is obtained. Details of an optimization procedure and examples of a film type are given below.

Optimization Procedure

Calculating the Intensity at the Pixel Area

Figure 7:
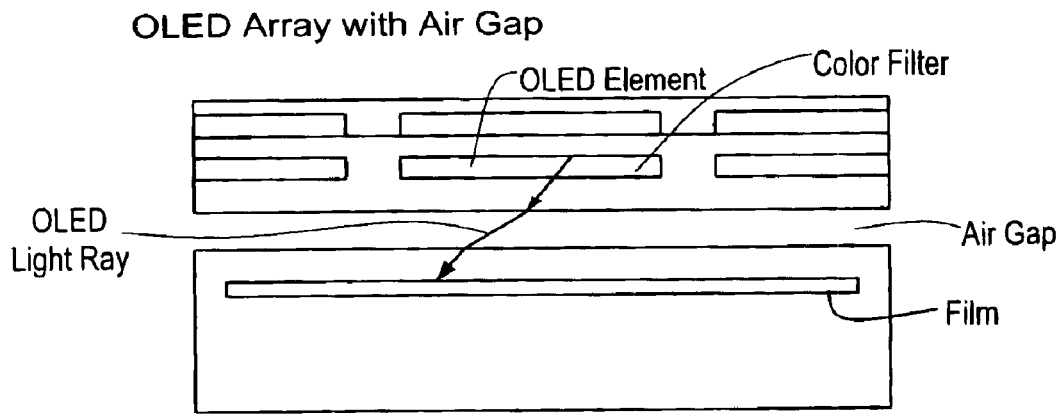
FIG. 7 is a graphical illustration of the geometry for the optimization calculations.
Figure 8:
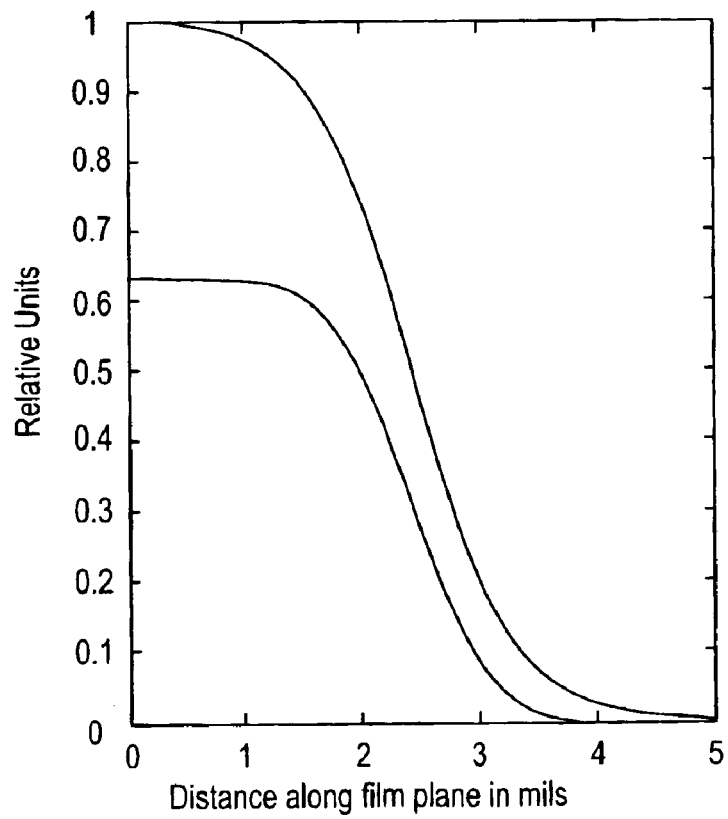
FIG. 8 depicts the calculated intensity profiles at a given pixel from one OLED element—color filter element set and for two given separations between the printhead and the photosensitive medium.

In other to calculate the intensity at the pixel area, the spread of the emission from each of the OLED elements is considered to be Lambertian. That is, the radiation intensity from each area of the source small enough to be considered a point source falls of as the cosine of the angle of between the observation point and the normal to the surface. (The intensity is defined as the power emitted per unit solid angle.) Thus, it is possible to calculate the intensity at the pixel area due to a source area taking into account the propagation of the light through the substrate material which will have a different index of refraction, as shown in FIG. 7. (A complete and general discussion of how to calculate the propagation of the radiation from the source to the pixel can be found in Jackson, *Classical Electrodynamics*, $2^{nd}$ edition, pp. 427–432, ISBN 0-471-43132-X) Calculated intensity profiles at a given pixel, from one OLED element—color filter element set and for two given separations between the printhead and the photosensitive medium, are shown in FIG. 8. Calculating the pixel area requires taking into account the MTF and sensitivity of the film and the radiation intensity at the pixel location. The method and techniques are well known to those skilled in the art.

Optimization of the Pixel Sharpness

Once the intensity profile at a given pixel, from one OLED element or one color filter array element and for a given separation between the printhead and the photosensitive medium, is known it is possible to calculate a function of the intensity that is a measure of the pixel sharpness. The most commonly used measure of pixel sharpness is the SQF (subjective quality factor). The SQF is defined from the intensity profile produced by one OLED element or color filter array element at a given pixel location at the photosensitive medium. The intensity profile produced by one OLED element or color filter array at a given pixel location at the photosensitive medium is the point spread function. To compute the SQF, the point spread function is represented in the spatial frequency domain (for a review of transforms from the space domain to the spatial frequency domain, see Dainty and Shaw, Image Science, Chapter 6, ISBN 0-12-200850-2). The magnitude of the transform of the point spread function is the modulation transfer function, MTF(f). The SQF is defined as $$\frac{\int_{u\min}^{u\max} MTF(u)d(\log u)}{\int_{u\min}^{u\max} d(\log u)}$$

where u max and u min are the spatial frequency limits of the of the visual bandpass response.

This is the SQF as defined by Granger and Cupery (Granger, Cupery, *Phot. Sci. Eng.*, Vol. 15, pp. 221–230, 1972), who correlated the calculated SQF with acceptance ranking by observers. They found that an SQF close to 100% (or higher) obtains the highest quality ranking for sharpness. Thus, the SQF is a good measure of pixel sharpness.

Crosstalk

Figure 9:
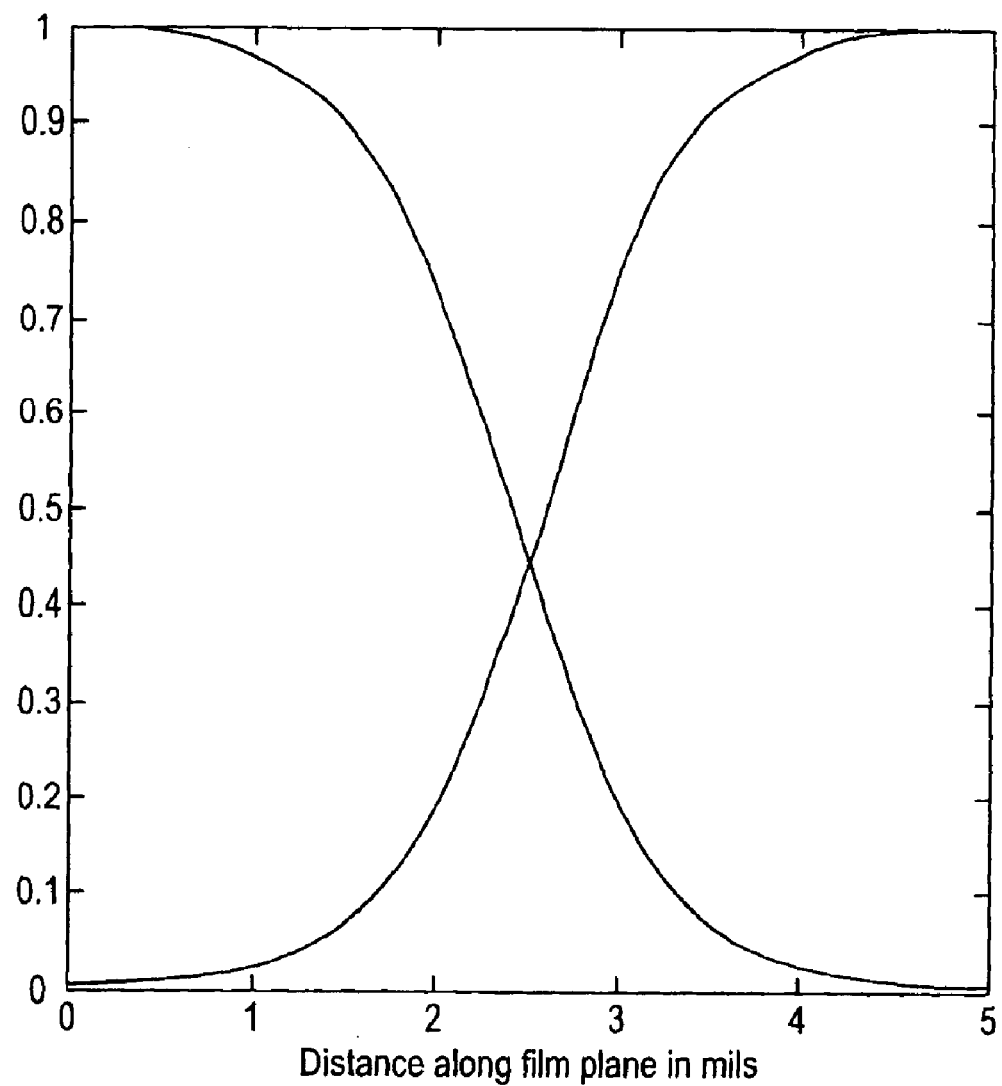
FIG. 9 depicts the calculated intensity profile produced by adjacent color filter array element—OLED element sets at given pixel locations at the photosensitive medium.

Crosstalk arises from the fact that emission from light emitting diodes is Lambertian, which means that some of the light emitted from any diode or filter will expose the medium in an adjacent area. In other words, the output from any given diode or color filter will expose nearest neighbor image pixels to some extent. Some overlap is acceptable since it leads to a uniform intensity profile. The calculation of crosstalk is similar to that of pixel sharpness. That is, the intensity profile produced by adjacent color filter array elements at given pixel locations at the photosensitive medium is calculated. An example is shown in FIG. 9. The intersection of the two normalized intensity lines has an absolute optimum value of 0.5. Values close to 0.5 are considered optimized designs.

Optimization Considerations for the Printheads Of FIGS. 2B, 5B

Figure 10:
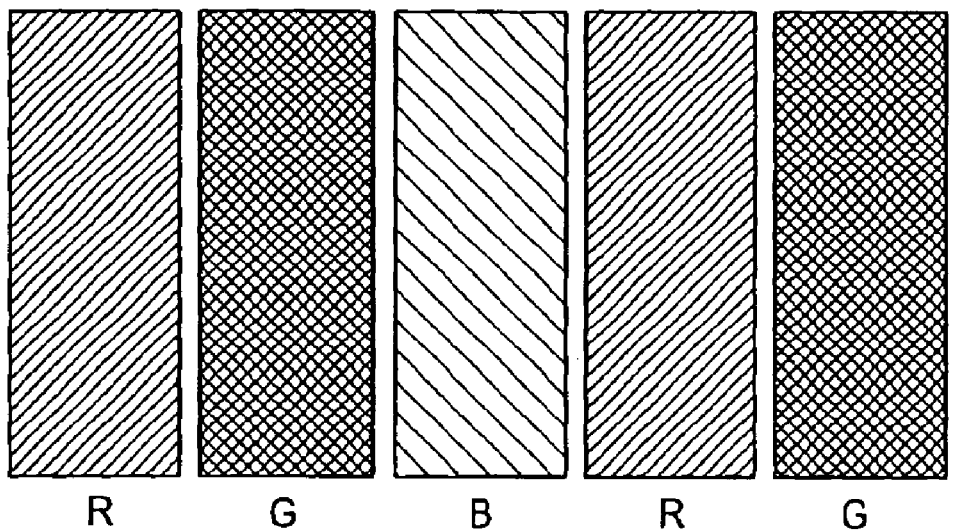
FIG. 10 depicts, for the Printheads of FIGS. 2B and 5B, the calculated intensities for the three wavelength ranges of the triplet, as well as the crosstalk and the point spread function due to elements emitting in the same wavelength range.
Figure 10:
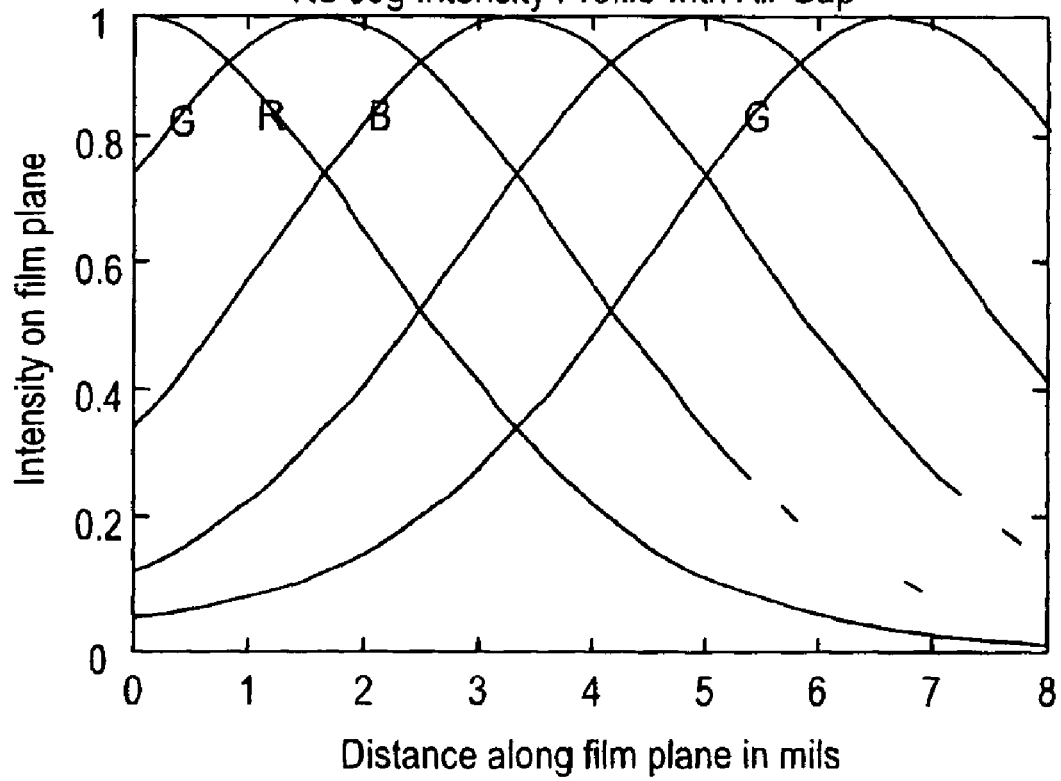

In the case where each color filter array is comprised of a plurality of triplets of color filters (FIGS. 2B and 5B), the calculations of pixel sharpness and crosstalk proceed as above except that they are carried out for the elements emitting in the same wavelength range (for example, the elements emitting in the red, or in the green, or in the blue). One additional consideration is the overlap of intensities from different wavelength ranges. This overlap results in a slight loss in color gamut. The intensities for the three wavelength ranges of the triplet, as well as the crosstalk and the point spread function due to elements emitting in the same wavelength range, can be seen in FIG. 10.

Sample Calculations
Photosensitive Medium (Film) 2

For a Photosensitive medium (film) with the properties given in Table 1.

TABLE 1

Sensitivity Of Film 2.

Figure 11:
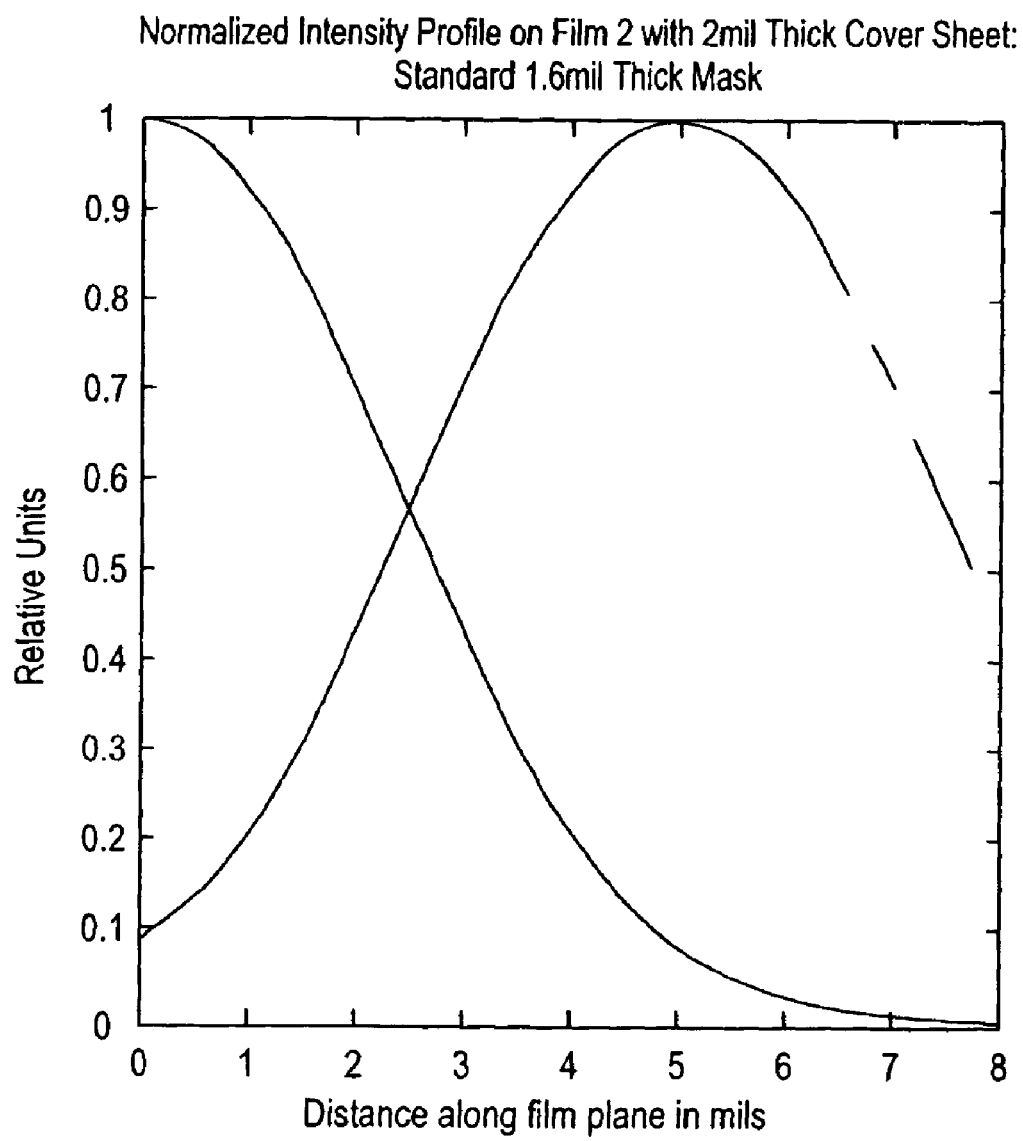
FIG. 11 depicts the calculated intensity profile produced by adjacent color filter array element—OLED element sets at given pixel locations at the photosensitive medium for the conditions of Tables 1 and 2.

| Sensitivity | Joules/cm$^2$ |
|---|---|
| Red, Green or Blue | $1.0 \times 10^{-8}$ | and a printhead as shown in FIG. 2A with the parameters given in Table 4, the SQF as a function of air gap thickness is shown in the Table 3 and the crosstalk is given in FIG. 11.

TABLE 2

OLED Printer Parameters For The Case Of Film 2.

| OLED Printer Parameters | | |
|---|---|---|
| DPI | 200 | |
| d (Characteristic dimension of OLED = 2 *$_d$) | 2.4 | mils |
| Distance between the centers of any two OLED elements | 5.0 | mils |
| Index of refraction of the OLED substrate or cover | 1.485 | |

TABLE 3

Pixel SQF As A Function Of Filter Cover Thickness, Air Gap And Film Cover Thickness.

| Filter Cover Refractive Index | 1.48 | 1.48 | 1.48 |
|---|---|---|---|
| Filter Cover Thickness (mils) | .5 | .5 | .5 |
| Mask (air gap) Thickness (mils) | 1.6 | .5 | 1.6 |
| Film Cover Sheet Thickness (mils) | 3.0 | 3.0 | 2.0 |
| SQF (pixel) | 95.0 | 96.7 | 96.0 |

Thus, embodiments have been disclosed that provide a printhead that is light weight and compact, where an OLED—Color Filter structure is deposited onto a substrate and, the printhead is designed for contact or quasi-contact printing printing, without additional optical elements, with the desired pixel sharpness and reduced crosstalk Other embodiments of the invention, including combinations, additions, variations and other modifications of the disclosed embodiments will be obvious to those skilled in the art and are within the scope of the following claims.

What is claimed is:

1. An apparatus for exposing a photosensitive material, said photosensitive material having a light receiving surface and being exposed by radiation impinging on said light receiving surface, said apparatus comprising:

a substantively transparent substrate having a substantially planar light receiving surface oppositely spaced apart from and substantively parallel to a substantially planar light emitting surface;

at least one of a plurality of triplets of elongated arrays of color filter elements, said color filter elements selectively transmitting radiation in a distinct range of wavelengths, having a substantially planar color filter light receiving surface oppositely spaced apart from and substantively parallel to said substantially planar color filter light emitting surface, any color filter element in the array has a characteristic surface dimension which is substantially the same for all color filter elements in the array and from which a center point can be defined, said color filter being formed from at least one color filter material, said at least one color filter material to form said at least one elongated color filter array being deposited onto and in effective light transmission relation to the light receiving surface of said substrate;

at least one of a plurality of triplets of elongated array of individually addressable Organic Light Emitting Diode (OLED) elements, said elements emitting light over a broad range of wavelengths, any OLED element in said at least one of a plurality of said elongated arrays has a characteristic surface dimension which is substantially the same for all OLED elements in the array and from which an OLED center point can be defined, said at least one OLED array being deposited onto and in effective light transmission relation to the light receiving surface of said at least one color filter array, the OLED center points for any said OLED array being substantially collinear and aligned with the respective color filter center points for the color filter array located in effective light transmission relation to that OLED array; and wherein each OLED array in the triplet is in effective light transmission relation to the light receiving surface of one color filter array in the triplet thereby constituting an OLED color filter array set, each set in the triplet being aligned in substantially parallel spaced relation with respect to each other set in the triplet, each color filter array in each triplet being capable of transmitting radiation in a distinct wavelength range different from the distinct wavelength range of the other two arrays in the triplet, each triplet being aligned in substantially parallel spaced relation with respect to any other triplet, and wherein the planar light emitting surface of said at least one color filter array is oppositely spaced apart at a given distance from and substantively parallel to the light receiving surface of said photosensitive material, the color filter elements in any of the color filter arrays are spaced apart by a given spacing between centers of the color filters, and the radiation emanating from any color filter in any said array and impinging on said light receiving surface of said photosensitive material defines a pixel area on the light receiving surface of said photosensitive material, said pixel area having a characteristic pixel dimension, and wherein said distance between the planar light emitting surface of said at Least one color filter array and the light receiving surface of photosensitive material, the distance between the light receiving surface of said substrate and the light emitting surface of said substrate, said spacing between centers of the color filters, and said characteristic surface dimension of the color filters are jointly selected so that, at a given pixel area, said pixel area corresponding to a given color filter element in a given color filter array, the exposure of said photosensitive material due to the light intensity from the elements of the given array which are adjacent to said given color filter element and from said given color filter element, is optimized.

2. The apparatus of claim 1 wherein the color filter material is an imageable material.

3. The apparatus of claim 1 wherein the color filter material is a colorant.

4. The apparatus of claim 1 wherein every said color filter element further comprises a region substantially adjoining the entire periphery of said color filter element, and said region substantively absorbing radiation in all three distinct wavelength ranges, each said distinct wavelength range being associated with a color filter in a said triplet.

* * * * *